(12) United States Patent
Ranish

(10) Patent No.: US 10,872,790 B2
(45) Date of Patent: Dec. 22, 2020

(54) OPTICAL SYSTEM

(71) Applicant: Applied Materials, Inc., Santa Clara, CA (US)

(72) Inventor: Joseph M. Ranish, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1187 days.

(21) Appl. No.: 14/867,788

(22) Filed: Sep. 28, 2015

(65) Prior Publication Data
US 2016/0111306 A1 Apr. 21, 2016

Related U.S. Application Data

(60) Provisional application No. 62/066,235, filed on Oct. 20, 2014.

(51) Int. Cl.
*H01L 21/67* (2006.01)
*H05B 3/00* (2006.01)

(52) U.S. Cl.
CPC ...... *H01L 21/67115* (2013.01); *H05B 3/0047* (2013.01)

(58) Field of Classification Search
CPC ............ H01L 21/67115; H05B 3/0033; H05B 3/0038; H05B 3/0047; F24K 9/275; F21V 5/043
USPC ....... 392/407, 411, 412, 413, 415, 416, 418, 392/423, 424; 219/405, 411; 362/92,
(Continued)

(56) References Cited

U.S. PATENT DOCUMENTS 5,632,547 A * 5/1997 Ge ..................... F21V 7/005
362/16
5,683,173 A * 11/1997 Gronet ................. C23C 16/481
219/405

(Continued)

FOREIGN PATENT DOCUMENTS

TW   200945477 A   11/2009
TW   200946722 A   11/2009

(Continued)

OTHER PUBLICATIONS

International Search Report and Written Opinion for International Application No. PCT/US2015/056402 dated Feb. 3, 2016.

(Continued)

*Primary Examiner* — Justin C Dodson
(74) *Attorney, Agent, or Firm* — Patterson + Sheridan, LLP

(57) ABSTRACT

Implementations of the present disclosure generally relate to an improved lamphead assembly for use in a thermal processing chamber. In one implementation, a lamphead assembly comprises a lamp housing tube comprising a lamp disposed therein, the lamp housing tube having an open end facing towards the substrate support, and an insert tube disposed within the lamp housing tube, the insert tube surrounds at least a portion of the lamp and has a constant inner diameter throughout the entire length of the insert tube, wherein the insert tube collimates radiant energy from the lamp toward the substrate support. The insert tube comprises a cylindrical lower portion disposed adjacent to the open end of the lamp housing tube, and a tapered upper portion integrated with the cylindrical lower portion as one body.

9 Claims, 9 Drawing Sheets

(58) Field of Classification Search
USPC .............. 362/294, 373, 264, 217.01, 217.05, 362/217.06, 217.07
See application file for complete search history.

(56) References Cited

U.S. PATENT DOCUMENTS

| | | | |
|---|---|---|---|
| 6,072,160 A * | 6/2000 | Bahl | C23C 16/481 |
| | | | 219/405 |
| 6,805,466 B1 | 10/2004 | Ranish | |
| 6,892,029 B2 * | 5/2005 | Tsuchida | G03B 15/03 |
| | | | 362/13 |
| 7,762,701 B2 * | 7/2010 | Luo | F21K 9/00 |
| | | | 362/545 |
| 8,272,771 B2 | 9/2012 | Arai | |
| 2006/0018639 A1 | 1/2006 | Ramamurthy et al. | |
| 2006/0066193 A1 * | 3/2006 | Ranish | H01L 21/67115 |
| | | | 313/116 |
| 2006/0274529 A1 * | 12/2006 | Cao | F21K 9/233 |
| | | | 362/294 |
| 2009/0212037 A1 | 8/2009 | Ranish et al. | |
| 2014/0103024 A1 * | 4/2014 | Kobayashi | F27B 17/0025 |
| | | | 219/402 |
| 2014/0199056 A1 | 7/2014 | Chang et al. | |

FOREIGN PATENT DOCUMENTS

| | | |
|---|---|---|
| TW | 201128708 A | 8/2011 |
| WO | 2009016586 A1 | 2/2009 |

OTHER PUBLICATIONS

Office Action from Taiwan Patent Application No. 104132586 dated Jun. 28, 2019.

* cited by examiner

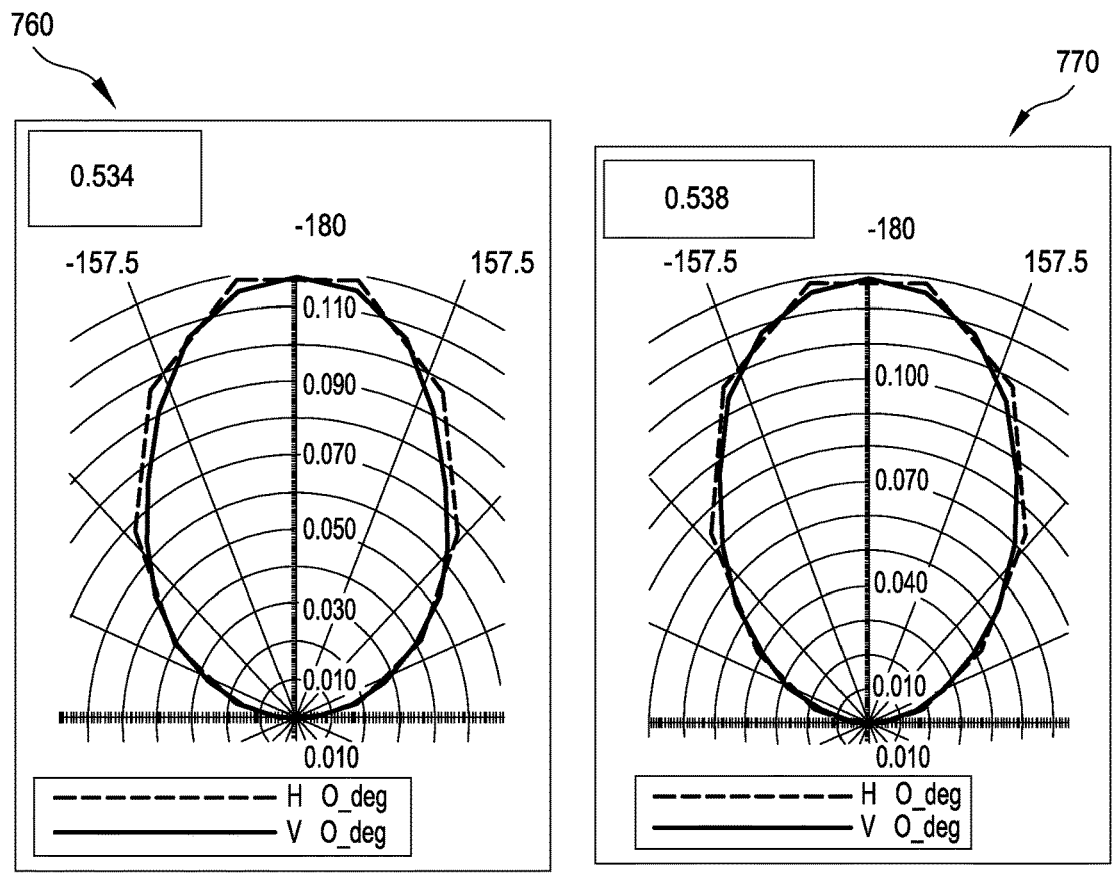
FIG. 7C
FIG. 7D
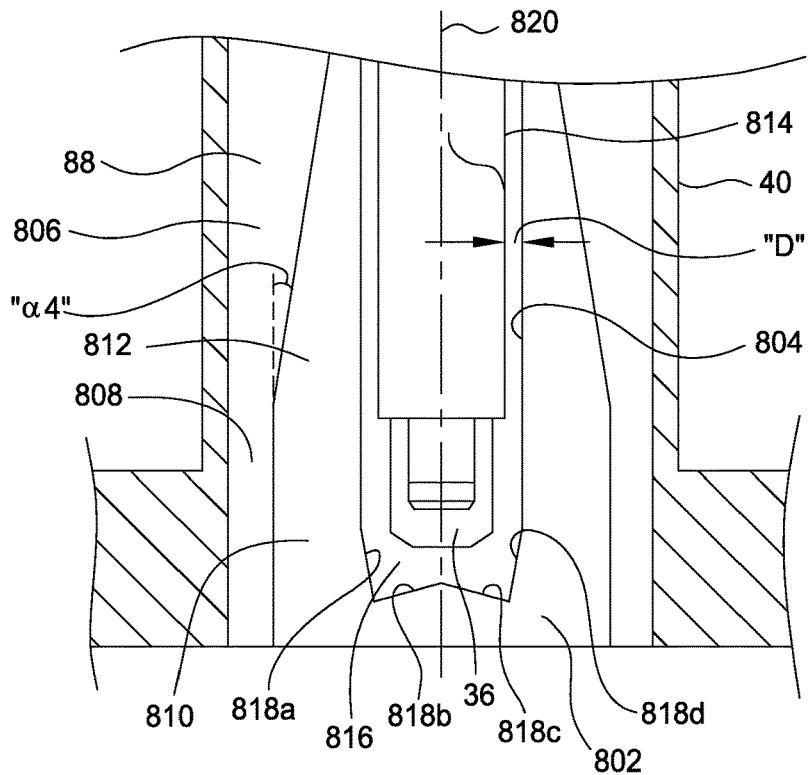
FIG. 8A

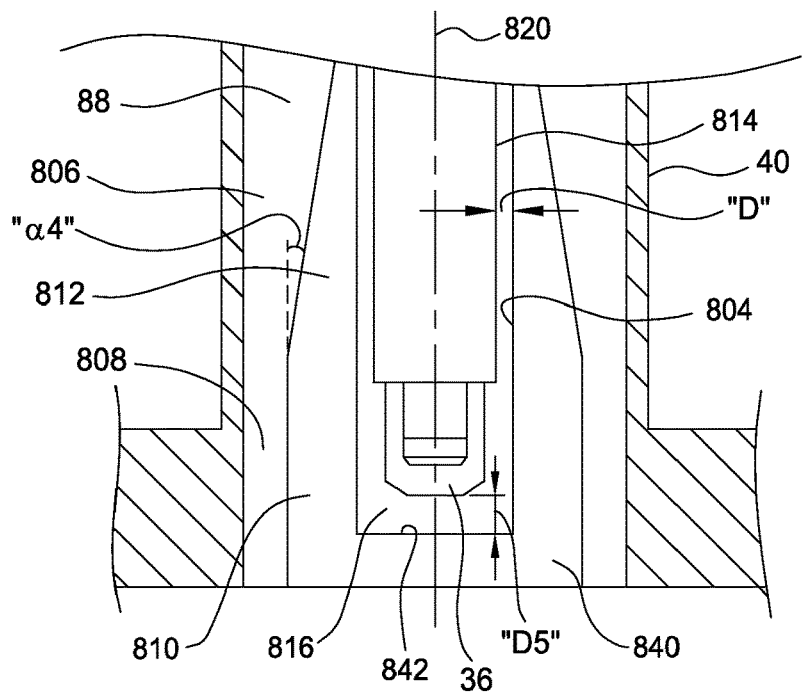
FIG. 8B
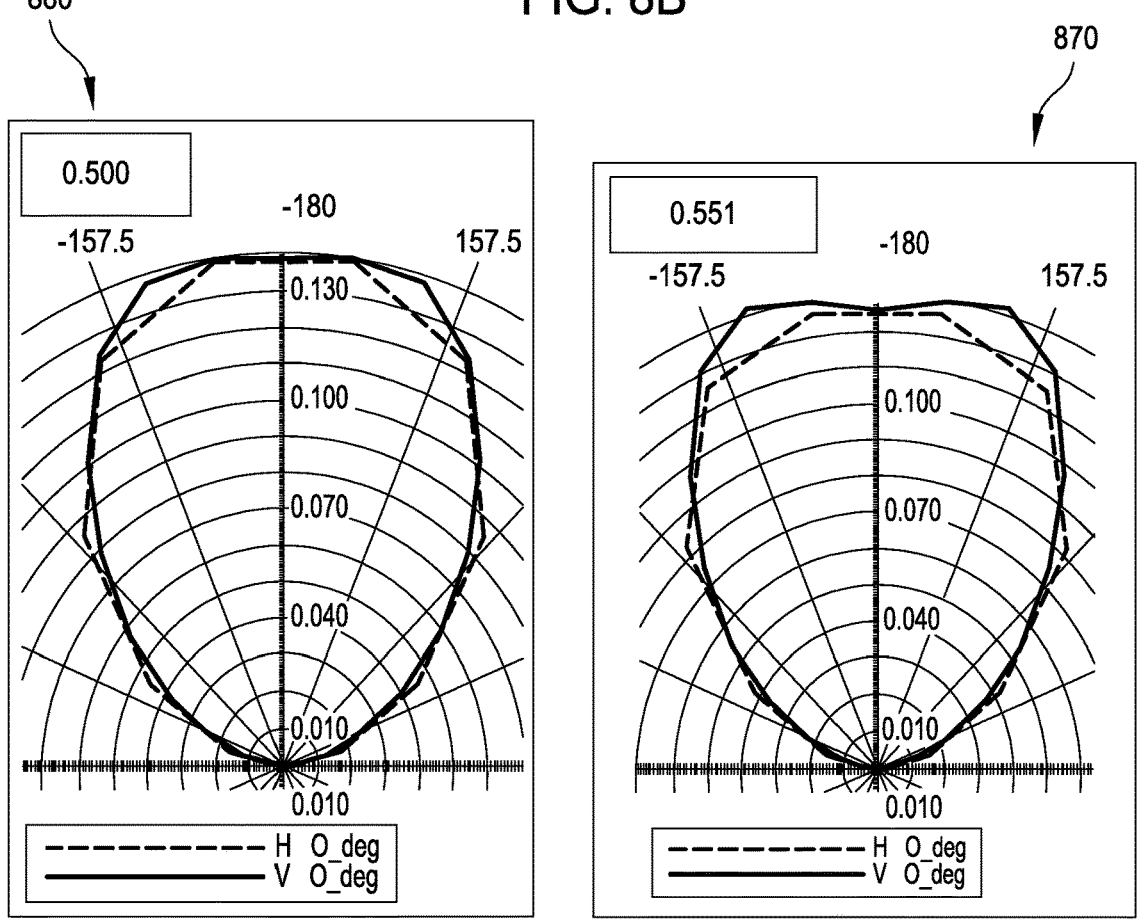
FIG. 8C
FIG. 8D

OPTICAL SYSTEM

CROSS-REFERENCE TO RELATED APPLICATIONS

This application claims benefit of U.S. provisional patent application Ser. No. 62/066,235, filed Oct. 20, 2014, which is herein incorporated by reference.

BACKGROUND

Field

Implementations of the present disclosure generally relate to an apparatus for thermally processing a substrate.

Description of the Related Art

Rapid thermal processing (RTP) systems are employed in semiconductor chip fabrication to create, chemically alter or etch surface structures on semiconductor wafers. A typical RTP system may include a semiconductor processing chamber and a lamphead assembly located within the semiconductor processing chamber. A number of radiant heat sources, such as lamps, are positioned within the lamphead. Each of the lamps is enclosed in a lamp assembly housing having a reflector sleeve. The reflector sleeve is used to reflect radiant energy toward the substrate to radiate a limited area of the substrate. During processing, infrared radiation from the lamps radiate onto a rotating semiconductor substrate in the processing chamber. In this manner, the wafer is heated to a required processing temperature.

In the semiconductor industry, it is desirable to obtain temperature uniformity over the substrate surface during temperature cycling of substrates. Surface temperature uniformity provides uniform process variables (e.g., layer thickness, resistivity and etch depth) for various temperature-activated steps such as film deposition, oxide growth and annealing. Therefore, improved lamp assembly for improved temperature uniformity over the substrate surface is desired for RTP and semiconductor processing applications.

SUMMARY OF THE DISCLOSURE

Implementations of the present disclosure generally relate to an improved lamphead assembly for use in a thermal processing chamber. In one implementation, the lamphead assembly comprises a lamp housing tube comprising a lamp disposed therein, the lamp housing tube having an open end facing towards the substrate support, and an insert tube disposed within the lamp housing tube, the insert tube surrounds at least a portion of the lamp and has a constant inner diameter throughout the entire length of the insert tube, wherein the insert tube collimates radiant energy from the lamp toward the substrate support. The insert tube comprises a cylindrical lower portion disposed adjacent to the open end of the lamp housing tube, and a tapered upper portion integrated with the cylindrical lower portion as one body.

In another implementation, the lamphead assembly comprises a lamp housing tube comprising a lamp disposed therein, the lamp housing tube having an open end facing towards the substrate support, an insert cap disposed within the lamp housing tube, wherein the insert cap is formed as a U-shaped body with its close end disposed towards the open end of the lamp housing tube, and the insert cap comprises a cylindrical lower portion defining a cavity for containing at least a portion of the lamp, and a tapered upper portion, and a reflector disposed between the insert cap and the lamp housing tube, wherein the reflector, the insert cap, and the lamp housing tube are generally coaxial.

In yet another implementation, a process chamber for processing a substrate is provided. The process chamber comprises a rotatable substrate support disposed within the process chamber, the substrate support having a substrate support surface, a lower dome disposed relatively below the substrate support, the lower dome comprising a central opening, a peripheral flange, and a bottom extended radially outward to connect the peripheral flange and the central opening, wherein a tangent line on an outside surface of the bottom that passes through an intersection of the bottom and the peripheral flange of the lower dome is at an angle of about 8° to about 16° with respect to a planar bottom surface of the peripheral flange of the lower dome, and an upper dome disposed relatively above the substrate support, the upper dome being opposed to the lower dome, the upper dome comprising a central window portion, and a peripheral flange engaging the central window portion at a circumference of the central window portion, wherein a tangent line on an inside surface of the central window portion that passes through an intersection of the central window portion and the peripheral flange is at an angle of about 8° to about 16° with respect to a planar upper surface of the peripheral flange. The process chamber also comprises a lamphead assembly disposed adjacent to the lower dome, comprising a lamp housing tube comprising a lamp disposed therein, the lamp housing tube having an open end facing towards the substrate support, and an insert tube disposed within the lamp housing tube, the insert tube surrounds at least a portion of the lamp and has a constant inner diameter throughout the entire length of the insert tube, wherein the insert tube collimates radiant energy from the lamp toward the substrate support, the insert tube comprises a cylindrical lower portion disposed adjacent to the open end of the lamp housing tube, and a tapered upper portion integrated with the cylindrical lower portion as one body.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIG. 7C shows a radiant intensity distribution plot of a lamp tube using an optical lens of FIG. 7A according to implementations of the disclosure.

FIG. 7D shows a radiant intensity distribution plot of a lamp tube using an optical lens of FIG. 7B according to implementations of the disclosure.

FIG. 8A is an enlarged, cross-sectional view of a portion of an assembly of a lamp housing tube according to other implementations of the disclosure.

FIG. 8B illustrates an enlarged, cross-sectional view of a portion of an assembly of a lamp housing tube according to another implementation of the disclosure.

FIG. 8C shows a radiant intensity distribution plot of a lamp tube using the insert cap of FIG. 8A.

FIG. 8D shows a radiant intensity distribution plot of a lamp tube using the insert cap of FIG. 8B.

DETAILED DESCRIPTION

Figure 1:
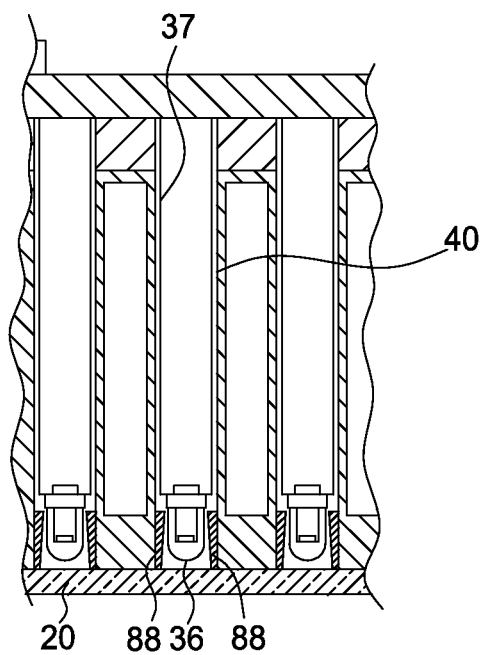
FIG. 1 illustrates a diagram of an individual lamp assembly.

Implementations of the disclosure generally relate to an improved lamphead assembly for use in a thermal processing chamber. FIG. 1 illustrates a diagram of three individual lamp assemblies in part of a lamp housing. Each lamp assembly is disposed within a lamp housing tube 40. The lamp assembly is comprised of a lamp tube 37 and a lamp 36 disposed at one end of the lamp tube 37. The lamp tube 37 may be part of the lamp housing tube 40. The open end of the lamp housing tube 40 is located adjacent to a transmission window 20. The lamp housing tube 40 in accordance with an implementation of the present disclosure is provided with silver specular reflectors 88.

Figure 2:
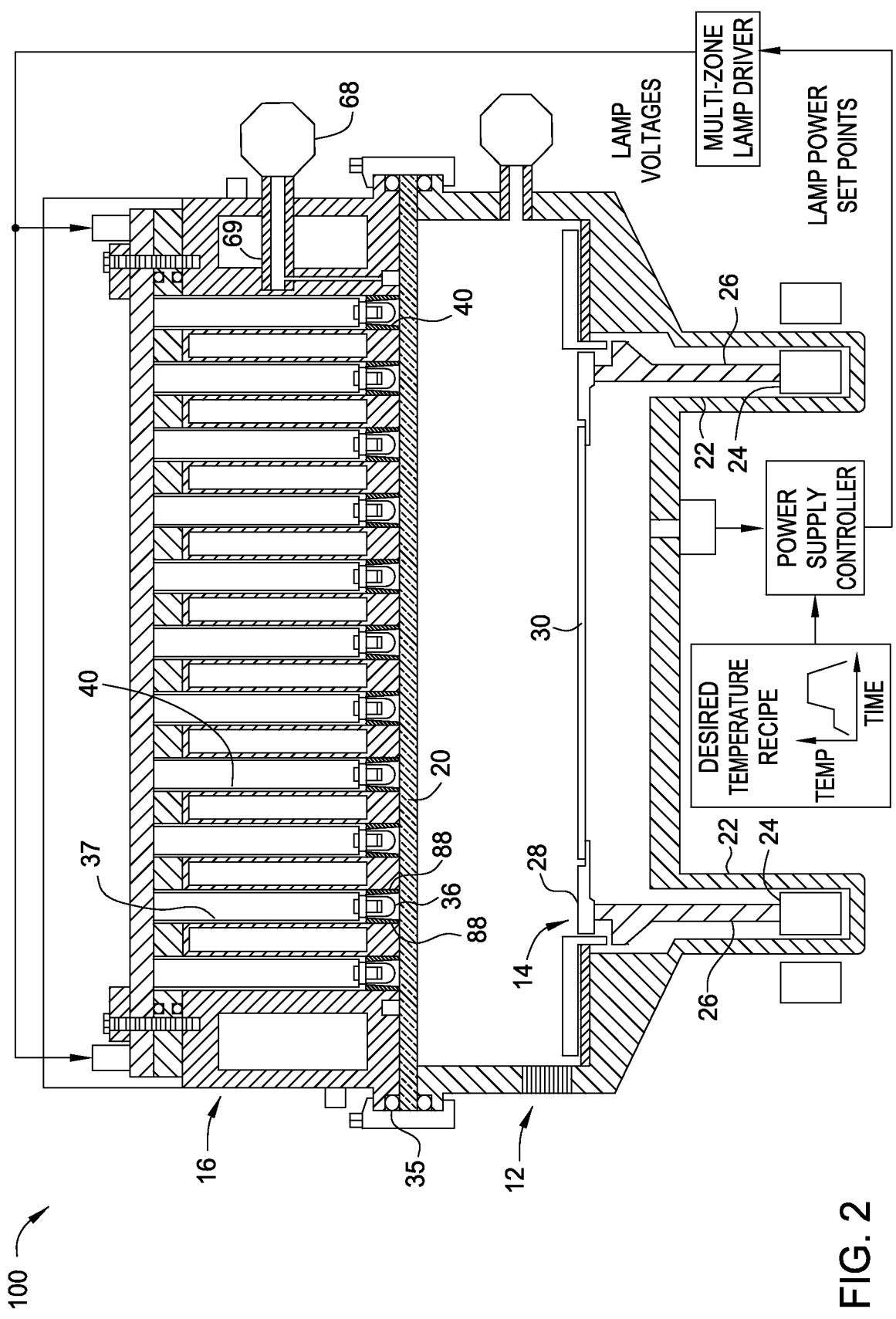
FIG. 2 is an enlarged schematic view showing a RTP processing chamber that may be used to practice various implementations of the present disclosure.

To provide a context for the use of a lamp tube in a heating assembly for heating a substrate in a thermal processing chamber, such as a rapid thermal processing (RTP) chamber, an exemplary chamber diagram is provided in FIG. 2. It should be understood that the chamber diagram provided herein is for illustrative purposes since the concept of the present disclosure may benefit any thermal process chamber using a lamp or a heating element emitting radiant energy, regardless of whether the lamp or heating element is disposed at a position relative above and/or below the substrate. In FIG. 2, a plurality of lamp tubes 37 is shown associated with a reduced-pressure or vacuum RTP chamber 12, a window 20, and a lamphead assembly 16 overlying the window 20. A substrate handling apparatus 14 includes a magnetically-levitated rotor 24 within the channel 22, a silicon-coated quartz support cylinder 26 resting on or otherwise coupled to the magnetic rotor, and a silicon-coated silicon carbide edge ring 28 resting on the support cylinder. During processing, a substrate or wafer 30 rests on the edge ring. The lamphead assembly 16 overlies the window 20. An O-ring 35 is located between the window 20 and the lamphead assembly 16 to provide a vacuum seal at that interface. The lamphead assembly 16 includes a plurality of lamps 36 each is housed within a respective lamp housing tube 40. Each lamp housing tube 40 can include a reflective inner surface, which may be coated with silver or gold or lined with specular reflectors 88. In one implementation, the lamps 36 are radiation emitting light bulbs such as tungsten-halogen lamps. The RTP chamber may also be used to process other sorts of substrates such as plastic panels, glass plates or disks and plastic workpieces.

The atmosphere of the chamber and of the lamphead assembly 16 can be controlled. For instance, a vacuum pump 68 is provided which can reduce the pressure in the lamphead through channel 69 in fluid communication with the lamphead as is shown in FIG. 2. In one implementation of the disclosure, to prevent tarnishing of the silver reflector, the atmosphere around the lamps is controlled to substantially minimize the amount of sulfide-forming or sulfide-catalyzing materials on the silver. One way of doing is to ensure that the atmosphere is substantially free of $H_2S$ and moisture ($H_2O$). One way of providing such an atmosphere is to prevent atmospheric air from entering into the area around lamps, for example by flowing helium through channel 69. Another way would be by using a filter and/or getters in the channel 69 to remove $H_2S$ and moisture from the atmosphere surrounding the lamps. Sulfide getters, for example, metal oxides such as iron oxide may be used.

Specular reflector 88 may be formed as a sleeve disposed within lamp housing tube 40 at an end proximate to the window 20. The specular reflector 88 may be constructed from aluminum. In some implementations, the specular reflector 88 could be incorporated onto the outer surface of the light capsule and separate reflector would not be needed. In some implementations, the specular reflector 88 may be an integral part of lamp housing tube 40. For example, the specular reflector 88 may have an upper portion which may be an integral part of lamp housing tube 40. The upper portion may be constructed from stainless steel or aluminum. The face of specular reflector 88 may be polished to improve reflectivity. The more reflective the surface of reflector 88, the more energy is reflected to reach a substrate 30 in chamber 12. Polishing may be accomplished by slowly machining specular reflector 88, or by the use of a polishing or buffing wheel after machining.

Figure 3:
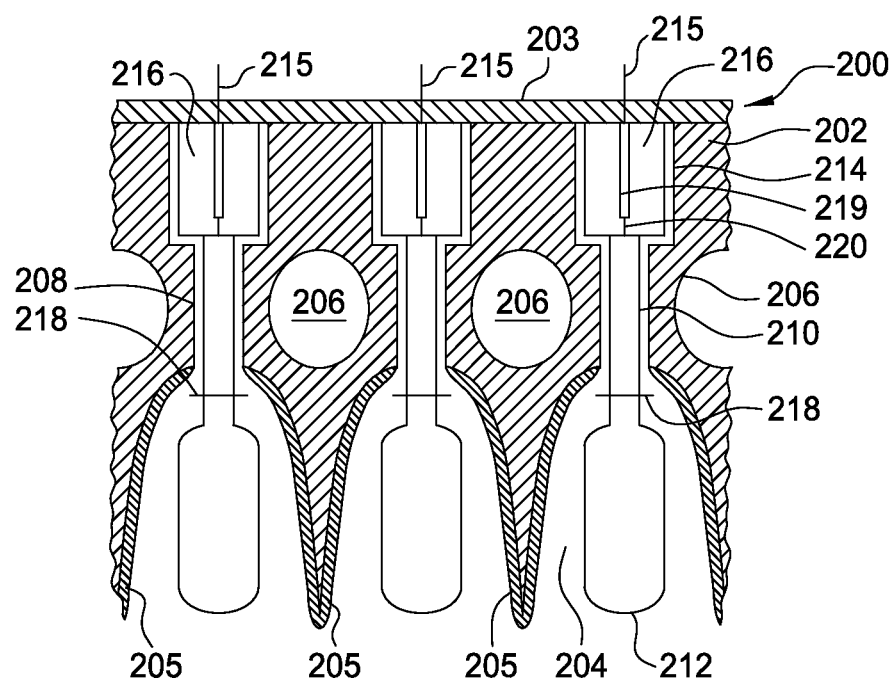
FIG. 3 is a schematic enlarged view showing a window assembly in accordance with one implementation of the present disclosure.

In an alternative implementation, heating lamps are placed in receptacles in a monolithic member forming a lamphead 200 as shown in FIG. 3. The lamphead 200 comprises a plurality of receptacles with a reflector cavity 204 containing a lamp 212. It should be understood that the lamphead 200 could be substituted for the plurality of lamp housing tubes 40 shown in FIG. 2. In the lamphead shown in FIG. 3, a plurality of circular coolant passages 206 are formed into the monolithic lamphead, in close proximity to the reflector cavities 204. The coolant passages 206 transport a cooling fluid such as water. The cooling fluid is introduced into the coolant passages via an inlet and removed at an outlet (not shown). A plurality of lead passages 208 are also formed in the lamphead-reflector 202. The lead passages 208 are sized to accept a press seal 210 of a lamp 212. A lamp shrink seal could also be used. Light from the lamps 212 is directed toward a substrate in the processing chamber by the reflector cavities.

A plurality of lampholder receptacles 214 is formed in the monolithic lamphead-reflector to receive lamp sockets or lampholders 216. Lampholders 216 have receptacles 219 that receive the outer two leads or pins 220 of the lamps. The lamp leads are electrically connected via receptacles 219 to respective wires of wiring pair 215, which provide power to the lamps. The lampholder receptacles support the lamps when they are plugged into the lamphead.

Each lamp may include a radiation shield 218 to prevent lamp radiation from entering the lead passage 208. The radiation shield 218 may be made of an aluminum, stainless steel or chrome-plated steel. The lamps may have no base other than the press seal or shrink seal, depending on which one is used. The lamp leads, as noted, engage directly into the lampholder to complete the electrical circuit. The outer lead or lamp seal can include features to enable a mechanical retention of the lamp, such as indents, which engage spring-loaded pins in the lampholder. A backing plate 203 can be secured to the uppermost surface of the lamphead-reflector 202 to hold the lampholders 216 within the lampholder receptacles 214.

In some implementations, the surface of specular reflector 88 shown in FIG. 2 is gold plated to prevent the surface from oxidizing and to maintain a high level of reflectivity. A nickel diffusion barrier may be placed on the surface prior to gold plating to prevent migration of gold into specular reflector 88. The nickel barrier may be applied using standard electroless nickel plating techniques, and thereafter high purity gold is applied by gold plating. Similarly, the reflector cavity 204 shown in FIG. 3 may have a reflecting coating 205, which in general includes gold as a reflective material.

In some implementations, the gold reflective material described above may be replaced by silver, which increases the efficiency of radiant energy delivery from lamp-reflector assembly to the substrate to be processed. Using silver as a reflective material increases the amount of radiation absorbed by the substrate to be processed by returning more of the unabsorbed "first bounce" radiation back to the wafer. It also reduces the heat loading on the lamphead and increases system efficiency. To avoid the potential tarnishing of silver, one may adapt a sulfide-free atmosphere in the lamphead as discussed above or by overcoating the silver with a transparent protective coating. Suitable materials for transparent protective coatings for silver containing reflecting material are silica, quartz, alumina, zirconia, $Si_3N_4$, zirconia, $Si_3N_4$, $CaF_2$, $MgF_2$, $TiO_2$, $Ta_2O_5$, $HfO_2$, yttria, and alumina-silica glass. Tarnishing can also be minimized by reducing the moisture in the lamphead atmosphere, since moisture facilitates the tarnish reaction. Adhesion between the transparent protective coating and the silver may be facilitated by using an adhesion layer. A diffusion barrier, such as Ni, and Ni—Cr alloys, including nitrided N—Cr alloys, may be further provided between the protective coating and the silver to prevent silver contamination.

In accordance with a further implementation of the present disclosure, silver-based reflectors may be used in epi (epitaxial) processing chambers. If silver-based reflectors are used in epi chambers, a sulfide or moisture scrubber/absorber in the cooling air flow or the use of a sulfide-free cooling gas may be included to enable the use of unprotected silver. Otherwise, a protective coating for a silver-based reflector or periodic cleaning may be performed.

For lower temperature processes, transparent polymer based coatings may be useful. The higher temperature versions of these are preferably silicone and/or fluoropolymer based. It has been shown that 100 Angstrom silicon nitride with nichrome or nitrided nichrome adhesion layers adequately protects silver from atmospheric tarnishing for years. With these types of coatings, it may be possible to use silver as a reflector even without a protective atmosphere in the lamphead. For the application in processing chambers, it may be desirable to cover a coating comprising silver with a very thin layer such as a flash coating of metals such as gold, platinum, rhodium, and palladium or a silver-alloy flash coating to prevent the silver from tarnishing. Alternately, an alloying agent such as Si or Ge may be added to the silver in amounts small enough so as not to seriously diminish the reflectivity of pure silver but large enough so as to form a protective oxide layer.

In alternative implementations, the reflector sleeve may comprise a thin quartz or other UV, VIS, NIR, or IR transparent material substrate, and instead of applying a silver coating to the inner surface of the sleeve, the outer surface can be coated to provide a back surface silver reflector on the transparent substrate.

Exemplary Lamphead Assembly

Figure 4A:
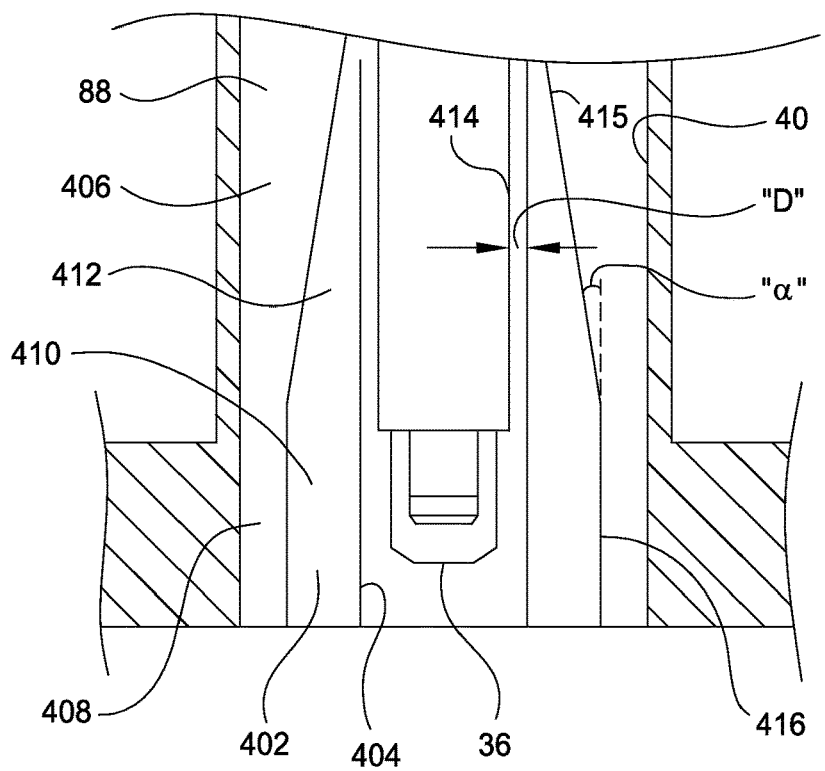
FIG. 4A is an enlarged, cross-sectional view of a portion of an assembly of a lamp housing tube according to implementations of the disclosure.

FIG. 4A is an enlarged, cross-sectional view of a portion of an assembly of a lamp housing tube 40 according to implementations of the disclosure. The open end of the lamp housing tube 40 is located adjacent to a window (not shown, such as the transmission window 20 shown in FIG. 2), or facing towards the substrate or a support cylinder (not shown, such as the support cylinder 26 shown in FIG. 2). The assembly of the lamp housing tube 40 is shown with a lamp 36 disposed therein. In one implementation, the specular reflector 88 which is formed as a sleeve is disposed within the lamp housing tube 40 at the open end adjacent the window. The specular reflector 88 may be a separate part from the lamp housing tube 40 as shown, or can be an integral part of the lamp housing tube 40. The specular reflector 88 is fixed to the lamp housing tube 40 such that the specular reflector 88 is aligned with the lamp 36. The specular reflector 88 may be coated with gold or silver as discussed above with respect to FIGS. 2 and 3.

To enhance the optical efficiency of the lamp, the lamp housing tube 40 may include an insert tube 402. The insert tube 402 reflects and collimates radiant energy from the lamp 36 toward the substrate to radiate a limited area of the substrate. The insert tube 402 is provided between the specular reflector 88 and the lamp 36. The insert tube 402 may be attached to the specular reflector 88 via an adhesion layer. Alternatively, the insert tube 402 and/or the specular reflector 88 may include a suitable retention/engaging feature to removably engage or disengage the insert tube 402 with the specular reflector 88. Suitable retention/engaging features may include spring-loaded balls, spring contacts/pins, a slider, a notch, groove, or the like. For example, the specular reflector 88 may have a notch on the interior surface configured to receive a spring-loaded pin provided on exterior surface of the insert tube 402 upon full insertion of the insert tube 402 into the specular reflector 88 or the lamp housing. The retention/engaging features allow an easy, fast replacement or installment of the insert tube without a complex tool.

The insert tube 402 is disposed to surround at least the light bulb of the lamp 36. The insert tube 402 may have a constant inner diameter throughout the entire length of the insert tube 402. The outer surface of the insert tube 402 may have a profile that follows the shape of the specular reflector 88. In one implementation, the specular reflector 88 has a conical shaped upper portion 406 and a cylindrical shaped lower portion 408. The insert tube 402 may include a cylindrical lower portion 410 having a profile that follows the cylindrical shaped lower portion 408 and a tapered upper portion 412 having a profile that follows the conical shaped upper portion 406. The tapered upper portion 412 may be integrated with the cylindrical lower portion 410 as one body. In one implementation, the tapered upper portion 412 is generally extended upwardly or outwardly from the cylindrical lower portion 410 along the longitudinal direction of the cylindrical lower portion 410. The tapered upper portion 412 of the insert tube 402 is defined by a taper angle "α" which can be approximately 1 degree to 45 degrees, for example about 3 degrees to about 20 degrees, for example about 6 degrees to about 10 degrees. The taper angle "α" described herein refers to an angle between a longitudinal direction of an outer surface 415 of the tapered upper portion 412 and a longitudinal direction of an outer surface 416 of the cylindrical lower portion 410. It is noted that the interpretation of the taper angle as described herein should equally apply to other implementations of this disclosure.

The tapered upper portion 412 may constitute a substantial portion of the length of the insert tube 402, for example about 10% to about 90%, for example about 30% to about 60% of the overall length of the insert tube 402. The tapered upper portion 412 may start upwardly at a point adjacent to the lamp 36, although other configurations are possible, depending upon the lamp collimation and/or substrate illumination requirements. As the taper angle increases, the amount of energy reflecting or escaping from the lamp housing tube 40 increases, thereby increasing the optical efficiency of the lamp 36. The optical efficiency is energy on target divided by source energy. Taper angle "α" may be empirically optimized to provide uniform illumination, any desired spatial intensity profile, or desired lamp efficiency.

The inner surface 404 of the insert tube 402 may be formed into a tubular or cylindrical shape. In one implementation, the insert tube 402 is circular in cross section. The insert tube 402 may have a different shape in cross section such as a rectangle, a square, a triangle, or any suitable polygonal shape. The diameter of the inner surface 404 should be sufficient to accommodate the lamp 36 with a minimum gap "D" between the inner surface 404 and the outer surface 414 of the lamp capsule. In one example, the gap "D" is about 0.5 mm to about 3 mm. The diameter of the inner surface 404 and the gap "D" may vary depending upon the size of the lamp 36. The specular reflector 88, the insert tube 402, and the lamp 36, once assembled or positioned in the lamp housing tube 40, are generally concentric or coaxial.

Figure 4B:
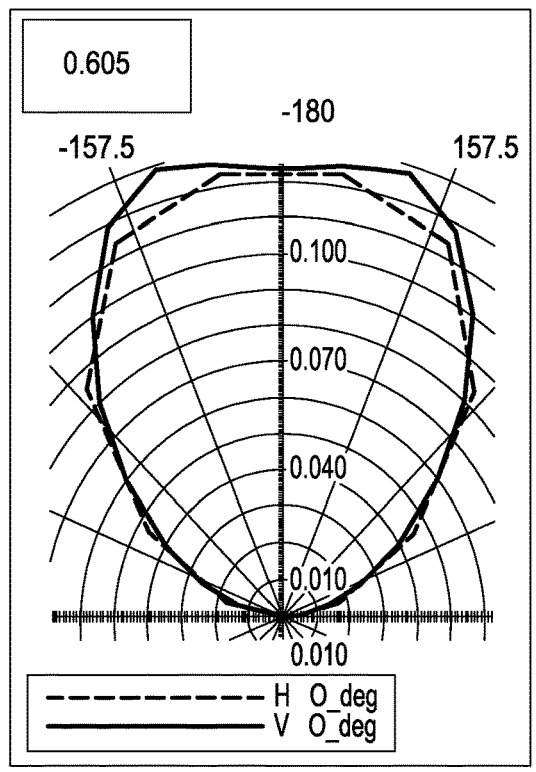
FIG. 4B shows a radiant intensity distribution plot of a lamp tube using a specular reflector and an insert tube according to implementations of the disclosure.
Figure 4C:
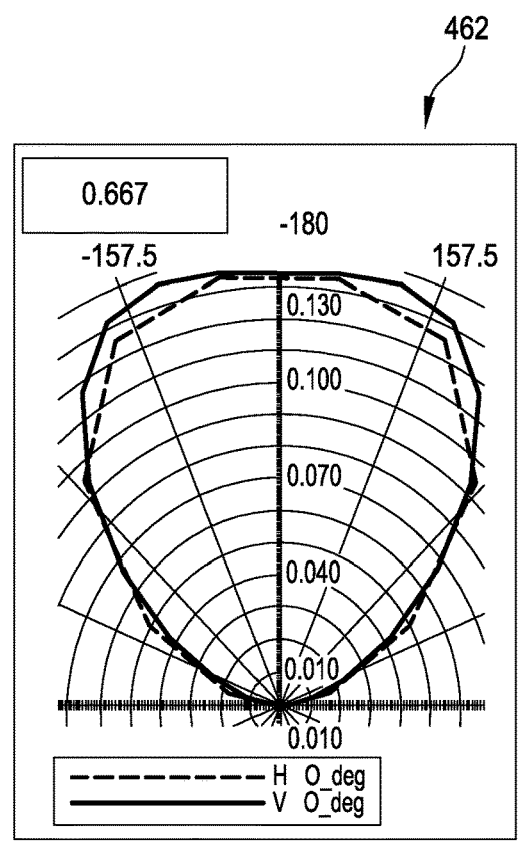
FIG. 4C shows a radiant intensity distribution plot of a lamp tube using only the specular reflector, without the insert tube according to implementations of the disclosure.

FIG. 4B shows a radiant intensity distribution plot 460 of a lamp housing tube using the specular reflector 88 and the insert tube 402. FIG. 4C shows a radiant intensity distribution plot 462 of a lamp housing tube using only the specular reflector 88, without the insert tube 402. In the plots 460, 462, the direction of angle of −180 is the optical axis direction normal to the substrate surface. The radiant intensity distribution is shown in the angular range of from −90 degrees to +90 degrees. The plots 460, 462 shows strong peaks remain in the vicinity of −180 degrees. The number in the left top column is the light intensity at −135 degrees divided by the light intensity at −180 degrees. The number can be used as a reference index to show how collimated the light is. The smaller the number is, the more collimated the light is. As can be seen, the plot 460 indicates a lamp housing tube using the insert tube 402 produces a light that is more collimated than the light produced by the lamp housing tube without the insert tube 402.

The insert tube 402 may be made of suitable material such as quartz, sapphire, silica, alumina, alumina-silica glass, yttrium-alumina-garnet (YAG), and the like. An insert made of quartz material may be advantageous since it has low coefficient of thermal expansion (about $5.5 \times 10^{-7}/°$ C.) in the relevant temperature range of about 300° C. to about 1450° C. The insert tube 402 may have a purity of at least 99.9% by weight of $SiO_2$. The insert tube 402 is provided to increase the collimation of the rays which ultimately exit the lamp housing tube. The collimation of divergent light rays enables the lamp to better control the radiation in the target region on the substrate surface. The insert tube 402 also serves as a cooling path to facilitate heat transfer from the lamp 36 to the outside world and/or the cooling fluid flowing in the coolant passage 206 formed in the lamphead. It has been observed that the use of the insert tube enables about 30%-40% and possibly up to 50% or more power to be delivered to the target without significant bulb swelling.

Figure 5A:
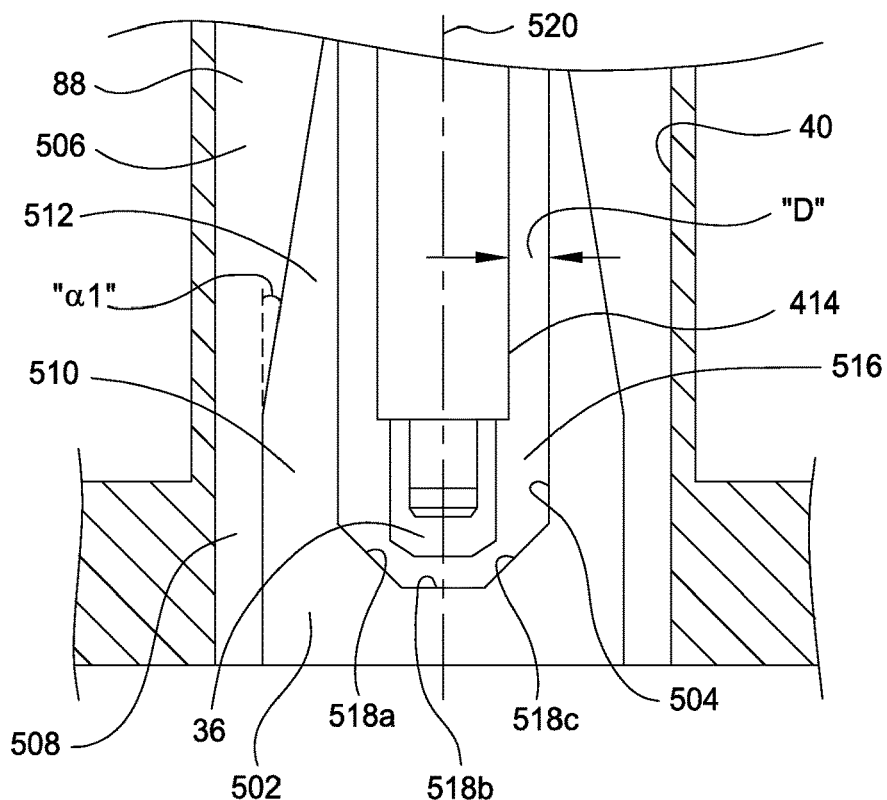
FIG. 5A is an enlarged, cross-sectional view of a portion of an assembly of a lamp housing tube according to other implementations of the disclosure.

FIG. 5A is an enlarged, cross-sectional view of a portion of an assembly of a lamp housing tube 40 according to other implementations of the disclosure. The assembly of the lamp housing tube 40 is shown with a lamp 36 disposed therein. The open end of the lamp housing tube 40 is located adjacent to a window (not shown, such as the transmission window 20 shown in FIG. 2). Similar to the implementation shown in FIG. 4, the specular reflector 88 which is formed as a sleeve is disposed within the lamp housing tube 40 adjacent at the open end adjacent the window. The specular reflector 88 may be a separate part from the lamp housing tube 40 as shown, or can be an integral part of the lamp housing tube 40. The specular reflector 88 is fixed to the lamp housing tube 40 such that the specular reflector 88 is aligned with the lamp 36. The specular reflector 88 may be coated with gold or silver as discussed above with respect to FIGS. 2 and 3.

To enhance the optical efficiency of the lamp, the lamp housing tube 40 may include an insert cap 502. The insert cap 502 reflects and collimates radiant energy from the lamp 36 toward the substrate to radiate a limited area of the substrate. The insert cap 502 is provided between the specular reflector 88 and the lamp 36. The insert cap 502 may be attached to the specular reflector 88 via an adhesion layer. The insert cap 502 is disposed to surround at least the light bulb of the lamp 36. In one implementation, the insert cap 502 is formed as a U-shaped body, where the close end of the insert cap 502 is disposed towards the open end of the lamp housing tube 40. The outer surface of the insert cap 502 may be coated with gold or silver as discussed above with respect to FIGS. 2 and 3. The outer surface of the insert cap 502 may have a profile that follows the shape of the specular reflector 88. In one implementation, the specular reflector 88 has a conical shaped upper portion 506 and a cylindrical shaped lower portion 508. The insert cap 502 may include a cylindrical lower portion 510 having a profile that follows the cylindrical shaped lower portion 508 and a tapered upper portion 512 having a profile that follows the conical shaped upper portion 506. The tapered upper portion 512 of the insert cap 502 is defined by a taper angle "α1" which can be approximately 1 degree to 80 degrees, for example about 5 degree to about 40 degrees. The tapered upper portion 512 may constitute a substantial portion of the length of the insert cap 502, for example about 10% to about 90%, for example 30% to about 60% of the overall length of the insert cap 502. The tapered upper portion 512 may start upwardly at a point adjacent to the lamp 36, although other configurations are possible, depending upon the lamp collimation and/or substrate illumination requirements. Taper angle "α1" may be empirically optimized to provide uniform illumination, any desired spatial intensity profile, or desired lamp efficiency.

The inner surface 504 of the insert cap 502 may be formed into a tubular or cylindrical shape. In one implementation, the insert cap 502 is circular in cross section. The insert cap 502 may have a different shape in cross section such as a rectangle, a square, a triangle, or any suitable polygonal shape.

The cylindrical lower portion 510 of the insert cap 502 defines a cavity 516 for containing the lamp 36. The cavity 516 should be sufficient to accommodate the lamp 36 with a minimum gap "D" between the inner surface 504 of the insert cap 502 and the outer surface 414 of the lamp capsule. In one example, the gap "D" is about 0.5 mm to about 3 mm. The cavity 516 and/or the diameter of the inner surface 504 and the gap "D" may vary depending upon the size of the lamp 36. The specular reflector 88, the insert cap 502, and the lamp 36, once assembled or positioned in the lamp housing tube 40, are generally concentric or coaxial.

The inner surface 504 of the insert cap 502 may have two or more reflective facets or two or more reflective surfaces of revolution configured to enhance the uniformity and intensity of the collimated light upon exiting the lamp housing tube 40. The neighboring facets may be contiguous with one another to form a domed geometry of the insert cap 502, i.e., the close end of the U-shaped body of the insert cap 502. In one implementation as shown, the insert cap 502 has three facets 518a, 518b, 518c arranged contiguous to one another at the close end of the insert cap 502. The facets 518a, 518b, 518c may be flat or with curvature. The facets 518a, 518b, 518c may be formed at an angle with respect to a central axis 520 passing through a longitudinal direction the lamp 36. For example, the facet 518a may have a flat surface at an angle of about 30° to about 65° with respect to the central axis 520, the facet 518b may have a flat surface at an angle of about 90° with respect to the central axis 520, and the facet 518c may have a flat surface at an angle of about 30° to about 65° with respect to the central axis 520. These angles are configured so that the light rays passing through the facets of the insert cap 502 are collimated and directed towards the substrate being processed with enhanced light uniformity and intensity.

The insert cap 502 may be made of suitable material such as quartz, sapphire, silica, alumina, alumina-silica glass, yttrium-alumina-garnet (YAG), and the like. Similar to the insert tube 402 discussed above, the insert cap 502 is provided to increase the collimation of the rays which ultimately exit the lamp housing tube. The collimation of divergent light rays enables the lamp to better control the radiation in the target region on the substrate surface. The insert cap 502 also serves as a cooling path to facilitate heat transfer from the lamp 36 to the outside world and/or the cooling fluid flowing in the coolant passage 206 (FIG. 3) formed in the lamphead. As a result, bulb life of the lamp 36 is improved. It has been observed that the use of the insert cap enables about 30%-40% and possibly up to 50% or more power to be delivered to the target without significant bulb swelling.

Figure 5B:
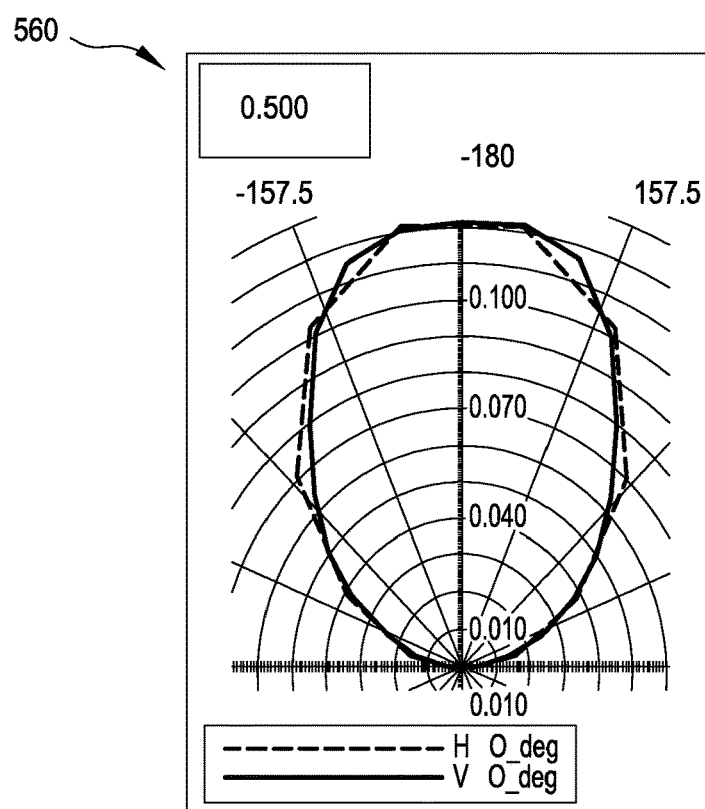
FIG. 5B shows a radiant intensity distribution plot of a lamp tube using an insert cap of FIG. 5A.

FIG. 5B shows a radiant intensity distribution plot 560 of a lamp housing tube using the insert cap 502. In the plot 560, the direction of angle of −180 is the optical axis direction normal to the substrate surface. The radiant intensity distribution is shown in the angular range of from −90 degrees to +90 degrees. The plot 560 shows strong peaks remain in the vicinity of −180 degrees. The number in the left top column is the light intensity at −135 degrees divided by the light intensity at −180 degrees. The number can be used as a reference index to show how collimated the light is. The smaller the number is, the more collimated the light is. As can be seen, the plot 560 indicates a lamp housing tube using the insert cap 502 produces a light that is more collimated than the light produced by the lamp housing tube using the specular reflector 88 without the insert cap 502 (plot 462 shown in FIG. 4C).

Figure 6A:
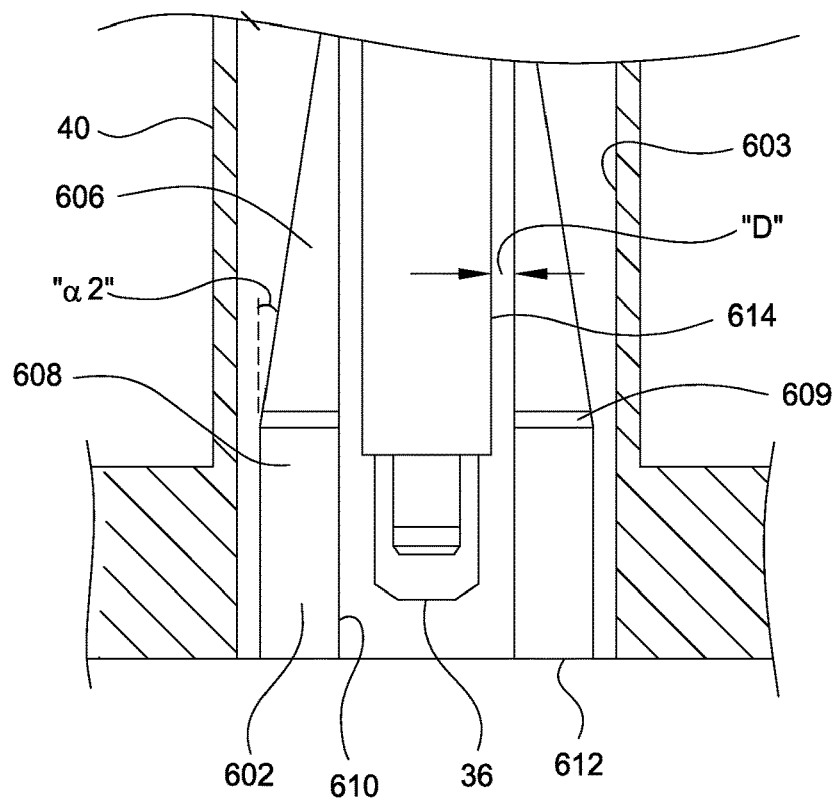
FIG. 6A is an enlarged, cross-sectional view of a portion of an assembly of a lamp housing tube according to other implementations of the disclosure.

FIG. 6A is an enlarged, cross-sectional view of a portion of an assembly of a lamp housing tube 40 according to other implementations of the disclosure. Contrary to the implementations of FIGS. 4A and 5A, the lamp housing tube 40 in this implementation does not use a specular reflector (such as the specular reflector 88). Instead, only an insert tube 602 is provided between the inner surface 603 of the lamp housing tube 40 and the lamp 36. The insert tube 602 is aligned with the lamp 36. The insert tube 602 also reflects and collimates radiant energy from the lamp 36 toward the substrate to radiate a limited area of the substrate. The inner surface 603 of the lamp housing tube 40 may be coated with silver or gold. The insert tube 602 may be fixed to the lower side of the lamp housing tube 40 via an adhesive layer so that at least the light bulb of the lamp 36 is surrounded by the insert tube 602. If desired, the outer surface of the insert tube 602 may be coated with gold or silver as discussed above with respect to FIGS. 2 and 3.

The outer surface of the insert tube 602 may have a profile that follows the inner surface 603 of the lamp housing tube 40. In one implementation, the insert tube 602 may include a tapered upper portion 606 and a cylindrical lower portion 608. The tapered upper portion 606 of the insert tube 602 is defined by a taper angle "α2" which can be approximately 1 degree to 80 degrees, for example about 5 degree to about 40 degrees. The tapered upper portion 606 may constitute a substantial portion of the length of the insert tube 602, for example about 10% to about 90%, for example 30% to about 60% of the overall length of the insert cap 502. The tapered upper portion 606 may start upwardly at a point adjacent to the lamp 36, although other configurations are possible, depending upon the lamp collimation and/or efficiency desired. Taper angle "α2" may be empirically optimized to provide uniform illumination, any desired spatial intensity profile, or desired lamp efficiency.

The inner surface 610 of the insert tube 602 may be formed into a tubular or cylindrical shape. In one implementation, the insert tube 602 is circular in cross section. The insert tube 602 may have a different shape in cross section such as a rectangle, a square, a triangle, or any suitable polygonal shape. The diameter of the inner surface 610 should be sufficient to accommodate the lamp 36 with a minimum gap "D" between the inner surface 610 and the outer surface 614 of the lamp capsule. In one example, the gap "D" is about 0.5 mm to about 3 mm. The diameter of the inner surface 610 and the gap "D" may vary depending upon the size of the lamp 36. The insert tube 602 and the lamp 36, once assembled or positioned in the lamp housing tube 40, are generally concentric or coaxial.

In some implementations, the outer surface of the insert tube 602 may be subjected to a surface treatment to function as various types of reflectors. The surface treatment could be provided on the outer surface of the tapered upper portion 606, the outer surface of a middle portion 609, and/or the outer surface of the cylindrical lower portion 608. In some implementations, the surface treatment may be provided so that at least 70% or more, for example about 80% or 95% of the outer surface of the insert tube 602 produce specular reflection of light. In some implementations, the surface treatment may be provided so that at least 80% or more, for example about 90% or 95% of the outer surface of the insert tube 602 in the middle portion 609 produce diffuse reflection of light while the outer surfaces above and below the middle portion 609 produce specular reflection of light. In some aspects of the above implementations, about 2%-10%, for example about 5% of the outer surface of the insert tube 602 may be treated to provide light absorption ability, for example by coating with an optical absorption layer. In some aspects of the above implementations, the rest of the outer surface of the insert tube 602 may be configured to function as a Fresnel-type reflector, which can be a flat surface having structures in the form of straight or arcuate ridges and grooves to allow such a reflector to mimic the operation of a curved reflector.

The surface treatment may include, but is not limited to a surface polishing, a reflective paint coating (such as gold or silver), a diffuse scattering component or a roughened surface treatment that will scatter light away from the lamp capsule. In some implementations, the surface treatment comprises a layer of sintered powder material on the outer surface of the insert tube 602 to scatter light away from the base and/or to minimize the movement of radiation towards the lamp capsule. The sintered powder material may comprise powdered quartz, alumina and mixtures thereof, and the sintered powder material may be mixed with a suitable binder such as a low melting point glass, for example, an alkali glass or $B_2O_3$. In some implementations, the surface treatment comprises a poured internal reflecting material, such as boron nitride. If desired, the surface treatment may also be provided onto the inner surface 610 of the insert tube 602 to scatter light away from the base of the lamp and/or minimize the flow of radiation towards the lamp capsule. The surface treatment helps maintain the lamp capsule at a lower operating temperature, which in turn improves the lamp life.

Although the surface treatment may make the radiant energy less collimated, it has been observed that the insert tube 602 is still able to collimate sufficient divergent light rays upon exiting the lamp housing tube 40. The collimation of divergent light rays enables the lamp to better control the radiation in the target region on the substrate surface. The insert tube 602 can also serve as a cooling path to facilitate heat transfer from the lamp 36 to the outside world and/or the cooling fluid flowing in the coolant passage 206 (FIG. 3) formed in the lamphead. As a result, bulb life of the lamp 36 is improved.

Figure 6B:
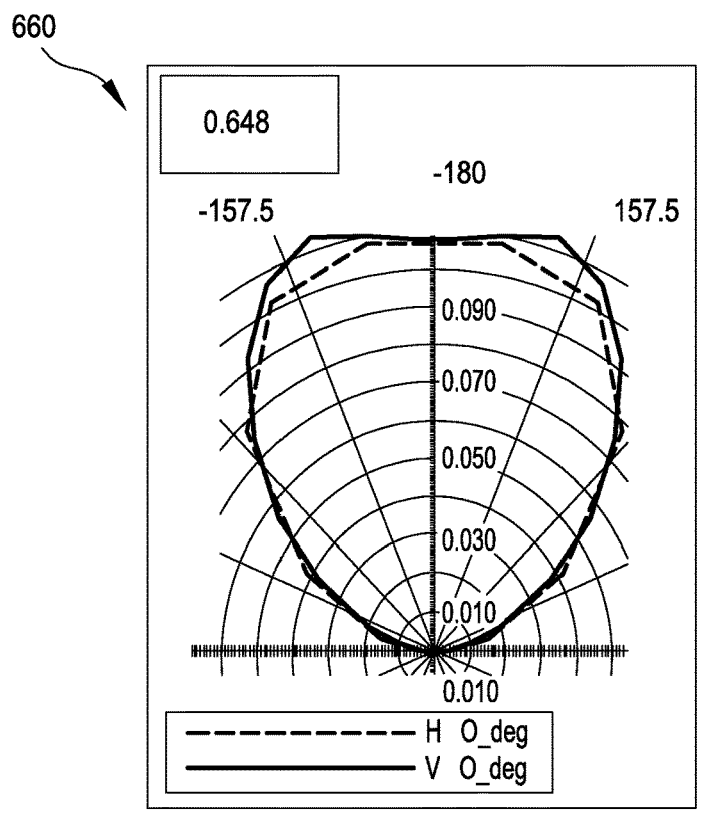
FIG. 6B shows a radiant intensity distribution plot of a lamp tube using an insert tube of FIG. 6A.

FIG. 6B shows a radiant intensity distribution plot 660 of a lamp housing tube using the insert tube 602. In the plot 660, the direction of angle of −180 is the optical axis direction normal to the substrate surface. The radiant intensity distribution is shown in the angular range of from −90 degrees to +90 degrees. The plot 660 shows strong peaks remain in the vicinity of −180 degrees. The number in the left top column is the light intensity at −135 degrees divided by the light intensity at −180 degrees. The number can be used as a reference index to show how collimated the light is. The smaller the number is, the more collimated the light is. As can be seen, the plot 660 indicates a lamp housing tube using the insert tube 602 produces a light that is relatively more collimated than the light produced by the lamp housing tube using the specular reflector 88 without the insert tube 602 (plot 462 shown in FIG. 4C).

Figure 7A:
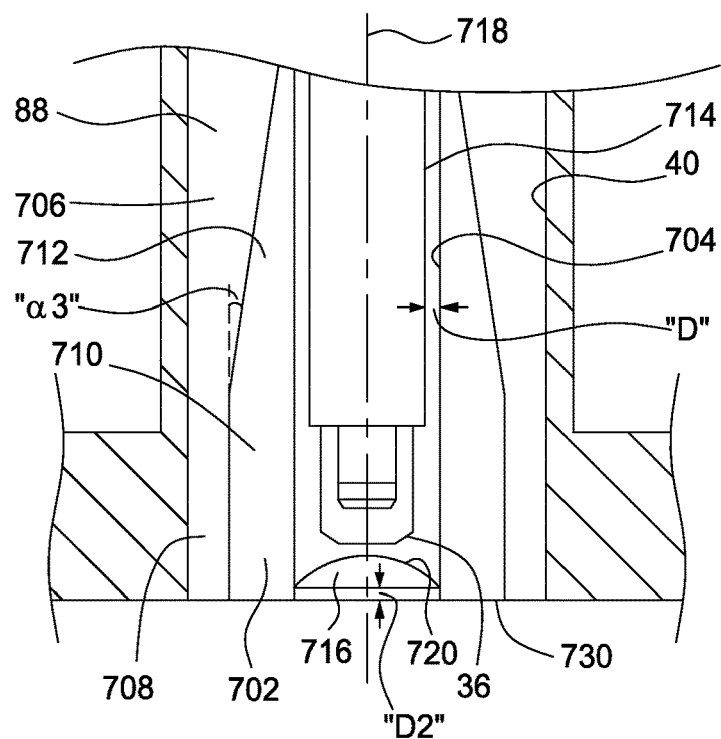
FIG. 7A is an enlarged, cross-sectional view of a portion of an assembly of a lamp housing tube according to other implementations of the disclosure.

FIG. 7A is an enlarged, cross-sectional view of a portion of an assembly of a lamp housing tube 40 according to other implementations of the disclosure. The assembly of the lamp housing tube 40 is shown with a lamp 36 disposed therein. The open end of the lamp housing tube 40 is located adjacent to a window (not shown, such as the transmission window 20 shown in FIG. 2). Similar to the implementation shown in FIG. 4A, the specular reflector 88 which is formed as a sleeve is disposed within the lamp housing tube 40 adjacent to the open end of the lamp housing tube 40. The specular reflector 88 may be a separate part from the lamp housing tube 40 as shown, or can be an integral part of the lamp housing tube 40. The specular reflector 88 is fixed to the lamp housing tube 40 such that the specular reflector 88 is aligned with the lamp 36. The specular reflector 88 may be coated with gold or silver as discussed above with respect to FIGS. 2 and 3.

To enhance the optical efficiency of the lamp, the lamp housing tube 40 may include an insert tube 702. The insert tube 702 reflects and collimates radiant energy from the lamp 36 toward the substrate to radiate a limited area of the substrate. The insert tube 702 is provided between the specular reflector 88 and the lamp 36. The insert tube 702 may be attached to the specular reflector 88 via an adhesion layer. The insert tube 702 is disposed to surround at least the light bulb of the lamp 36. The outer surface of the insert tube 702 may be coated with gold or silver as discussed above with respect to FIGS. 2 and 3. The outer surface of the insert tube 702 may be formed in accordance with the shape of the specular reflector 88. In one implementation, the specular reflector 88 has a conical shaped upper portion 706 and a cylindrical shaped lower portion 708. The insert tube 702 may include a cylindrical lower portion 710 in accordance with the cylindrical shaped lower portion 708 and a tapered upper portion 712 in accordance with the conical shaped upper portion 706. The tapered upper portion 712 of the insert tube 702 is defined by a taper angle "α3" which can be approximately 1 degree to 80 degrees, for example about 5 degree to about 40 degrees. The tapered upper portion 712 may constitute a substantial portion of the length of the insert tube 402, for example about 10% to about 90%, for example 30% to about 60% of the overall length of the insert tube 402. The tapered upper portion 712 may start upwardly at a point adjacent to the lamp 36, although other configurations are possible, depending upon the lamp collimation and/or efficiency desired. As the taper angle increases, the amount of energy escaping from the lamp housing tube 40 increases, thereby increasing the optical efficiency of the lamp 36. Taper angle "α3" may be empirically optimized to provide uniform illumination, any desired spatial intensity profile, or desired lamp efficiency The inner surface 704 of the insert tube 702 may be formed into a tubular or cylindrical shape. In one implementation, the insert tube 702 is circular in cross section. The insert tube 702 may have a different shape in cross section such as a rectangle, a square, a triangle, or any suitable polygonal shape. The diameter of the inner surface 704 should be sufficient to accommodate the lamp 36 with a minimum gap "D" between the inner surface 704 and the outer surface 714 of the lamp capsule. In one example, the gap "D" is about 0.5 mm to about 3 mm. The diameter of the inner surface 704 and the gap "D" may vary depending upon the size of the lamp 36. The specular reflector 88, the insert tube 702, and the lamp 36, once assembled or positioned in the lamp housing tube 40, are generally concentric or coaxial.

To further enhance the collimation of radiant energy onto a limited area of the substrate, the insert tube 702 may include an optical lens 716 to collimate the light emitted from the lamp 36 along a central axis 718 passing through the lamp 36. The optical lens 716 is disposed within the inner surface 704 of the insert tube 702. The optical lens 716 may be integral with, fixed to or attached to the inner surface 704 of the insert tube 702 adjacent to the open end of the lamp housing tube 40. In one implementation, the optical lens 716 is positioned to have a distance "D2" from the bottom 730 of the insert tube 702. The distance "D2" may be about 0 mm to about 10 mm, for example about 1 mm. The optical lens 716 can be fabricated from fused silica glass or fused quartz material. The optical lens 716 may be a collimating lens configured to convert divergent light emitted from the lamp 36 into substantially-parallel light along the central axis 718. The optical lens 716 may be configured and positioned with respect to the lamp 36 and the substrate to be processed based on the effective focal length of the optical lens 716 to provide a desired collimation of the output light onto a target region of the substrate. In one implementation, the optical lens 716 is a piano-convex lens (i.e., a simple spherical lens with a convex lens surface 720 facing toward the lamp 36). For a simple spherical lens having refractive index in the range of 1.3-1.5, radius of curvature can range from 0.08/mm to 0.2/mm, with a thickness ranging from 0.1 mm to 3 mm. Although the piano-convex lens is shown, the optical lens 716 may be a lens system comprising one or more of a biconvex lens, a convex-concave lens, a meniscus lens, a plano-concave lens, a biconcave lens, or any combination of the above and configured to provide effective collimation along the central axis 718.

Figure 7B:
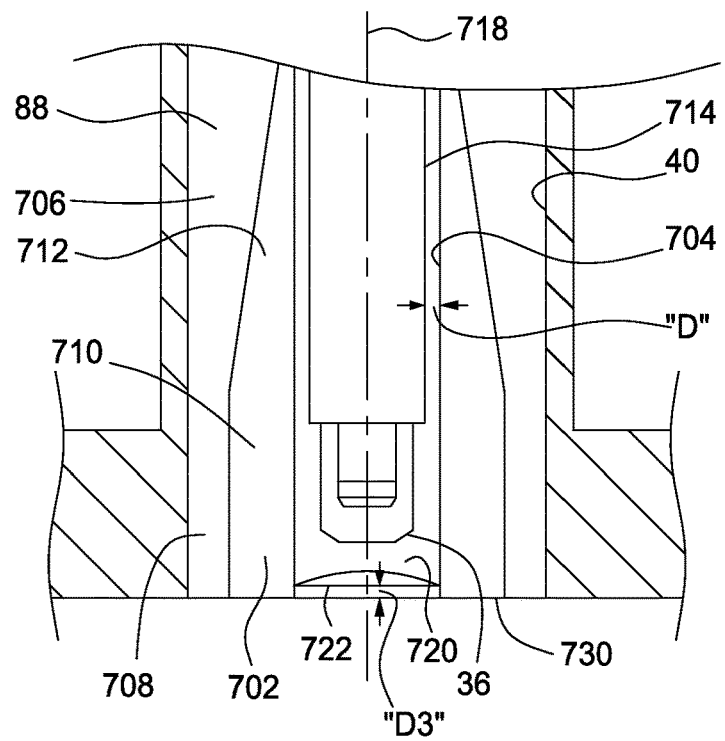
FIG. 7B illustrates an enlarged, cross-sectional view of a portion of an assembly of a lamp housing tube according to another implementation of the disclosure.

FIG. 7B illustrates an enlarged, cross-sectional view of a portion of an assembly of a lamp housing tube 40 according to another implementation of the disclosure. The implementation shown in FIG. 7B is identical to that of FIG. 7A except that the optical lens 716 is replaced with an optical lens 722 having a radius of curvature greater than that of the optical lens 716. The optical lens 722 may be positioned to have a distance "D3" from the bottom 730 of the insert tube 702. The distance "D3" may be about 0 mm to about 10 mm, for example about 1 mm. In various aspects, the distance "D3" may be greater or smaller than the distance "D2" of FIG. 7A. The specular reflector 88, the insert tube 702, and the lamp 36, once assembled or positioned in the lamp housing tube 40, are generally concentric or coaxial.

It should be understood that the distance D2-D3 and the tapered angle discussed in this disclosure may vary depending upon the desired characteristics of the process chamber and the substrate illumination requirements. By controlling these parameters, one is able to achieve a collimated, uniform intensity profile which can then be modulated by controlling the lamp power to individual lamps to provide dynamic temperature uniformity or simply improved steady state uniformity, while improving the lifetime of the individual lamps.

The combination of the specular reflector 88, the insert tube 702 and the optical lens 716, 722 increases the collimation of the rays which ultimately exit the lamp housing tube. The collimation of divergent light rays enables the lamp to better control the radiation in the target region on the substrate surface with improved light intensity and uniformity. The insert tube 702 also serves as a cooling path to facilitate heat transfer from the lamp 36 to the outside world and/or the cooling fluid flowing in the coolant passage 206 (FIG. 3) formed in the lamphead. As a result, bulb life of the lamp 36 is improved. It has been observed that the use of the insert tube and the optical lens enables about 30%-40% and possibly up to 50% or more power to be delivered to the target without significant bulb swelling.

FIG. 7C shows a radiant intensity distribution plot 760 of a lamp tube using the optical lens 716. FIG. 7D shows a radiant intensity distribution plot 770 of a lamp tube using the optical lens 722 having a radius of curvature greater than that of the optical lens 716. In the plots 760 and 770, the direction of angle of −180 is the optical axis direction normal to the substrate surface. The radiant intensity distribution is shown in the angular range of from −90 degrees to +90 degrees. The plots 760 and 770 show strong peaks remain in the vicinity of −180 degrees. The number in the left top column is the light intensity at −135 degrees divided by the light intensity at −180 degrees. The number can be used as a reference index to show how collimated the light is. The smaller the number is, the more collimated the light is. As can be seen, the plots 760 and 770 indicate a lamp tube using the optical lens 716, 722 produces a light that is more collimated than the light produced by the lamp tube using the specular reflector 88 without the insert tube 602 and lens (plot 462 shown in FIG. 4C).

FIG. 8A is an enlarged, cross-sectional view of a portion of an assembly of a lamp housing tube 40 according to other implementations of the disclosure. The assembly of the lamp housing tube 40 is shown with a lamp 36 disposed therein. The open end of the lamp housing tube 40 is located adjacent to a window (not shown, such as the transmission window 20 shown in FIG. 2). Similar to the implementation shown in FIG. 4, the specular reflector 88 which is formed as a sleeve is disposed within the lamp housing tube 40 adjacent at the open end adjacent the window. The specular reflector 88 may be a separate part from the lamp housing tube 40 as shown, or can be an integral part of the lamp housing tube 40. The specular reflector 88 is fixed to the lamp housing tube 40 such that the specular reflector 88 is aligned with the lamp 36. The specular reflector 88 may be coated with gold or silver as discussed above with respect to FIGS. 2 and 3.

To enhance the optical efficiency of the lamp, the lamp housing tube 40 may include an insert cap 802. The insert cap 802 reflects and collimates radiant energy from the lamp 36 toward the substrate to radiate a limited area of the substrate. The insert cap 802 is provided between the specular reflector 88 and the lamp 36. The insert cap 802 may be attached to the specular reflector 88 via an adhesion layer. The insert cap 802 is disposed to surround at least the light bulb of the lamp 36. In one implementation, the insert cap 802 is formed as a U-shaped body, where the close end of the insert cap 802 is disposed towards the open end of the lamp housing tube 40. The outer surface of the insert cap 802 may be coated with gold or silver as discussed above with respect to FIGS. 2 and 3. The outer surface of the insert cap 802 may have a profile that follows the shape of the specular reflector 88. In one implementation, the specular reflector 88 has a conical shaped upper portion 806 and a cylindrical shaped lower portion 808. The insert cap 802 may include a cylindrical lower portion 810 in accordance with the cylindrical shaped lower portion 808 and a tapered upper portion 812 in accordance with the conical shaped upper portion 806. The tapered upper portion 812 of the insert cap 802 is defined by a taper angle "α4" which can be approximately 1 degree to 80 degrees, for example about 5 degree to about 40 degrees. The tapered upper portion 812 may constitute a substantial portion of the length of the insert cap 802, for example about 10% to about 90%, for example 30% to about 60% of the overall length of the insert cap 802. The tapered upper portion 812 may start upwardly at a point adjacent to the lamp 36, although other configurations are possible, depending upon the lamp collimation and/or substrate illumination requirements. Taper angle "α4" may be empirically optimized to provide uniform illumination, any desired spatial intensity profile, or desired lamp efficiency.

The inner surface 804 of the insert cap 802 may be formed into a tubular or cylindrical shape. In one implementation, the insert cap 802 is circular in cross section. The insert cap 802 may have a different shape in cross section such as a rectangle, a square, a triangle, or any suitable polygonal shape.

The insert cap 802 defines a cavity 816 for containing the lamp 36. The cavity 816 should be sufficient to accommodate the lamp 36 with a minimum gap "D" between the inner surface 804 of the insert cap 802 and the outer surface 814 of the lamp capsule. In one example, the gap "D" is about 0.5 mm to about 3 mm. The cavity 816 and/or the diameter of the inner surface 804 and the gap "D" may vary depending upon the size of the lamp 36.

The inner surface 804 of the insert cap 802 may have two or more facets or two or more surfaces of revolution configured to enhance the uniformity and intensity of the collimated light upon existing the lamp housing tube 40. The neighboring surfaces of revolution may be contiguous with one another to form a domed geometry of the insert cap 802, i.e., the close end of the U-shaped body of the insert cap 802. In one implementation as shown, the insert cap 802 has five surfaces of revolution comprising the inner cavity. The insert cap 802 has facets or angled surfaces 818a, 818b, 818c, 818d arranged contiguous to one another at the close end of the insert cap 802. The angled surfaces 818a, 818b, 818c, 818d may be flat or have a curvature profile. In cases where the angled surfaces 818a, 818b, 818c, 818d have a flat surface, the angled surfaces may be at an angle with respect to a central axis 820 passing through the lamp 36. For example, the angled surface 818a may have a flat surface at an angle of about 3° to about 35° with respect to the central axis 820, the angled surface 818b may have a flat surface at an angle of about 92° to about 110° with respect to the central axis 820, the angled surface 818c may have a flat surface at an angle of about 92° to about 110° with respect to the central axis 820, and the angled surface 818d may have a flat surface at an angle of about 3° to about 35° with respect to the central axis 820. These angles are configured so that the light rays passing through the facets of the insert cap 802 are collimated and directed towards the substrate being processed with enhanced light uniformity and intensity.

FIG. 8B illustrates an enlarged, cross-sectional view of a portion of an assembly of a lamp housing tube 40 according to another implementation of the disclosure. The implementation shown in FIG. 8B is identical to that of FIG. 8A except that the insert cap 840 does not use facets as shown in FIG. 8A. Instead, the insert cap 840 has a flat portion 842 which constitutes the close end of the U-shaped body. The flat portion 842 of the quart insert cap 840 is at a distance "D5" from the end point of the lamp 36. In some examples, the distance "D5" may be about 0.5 mm to about 3 mm. The distance "D5" may vary depending upon the size of the lamp 36 and the substrate illumination requirements. This implementation allows easy manufacture of the insert cap.

The insert cap 802 and 840 are provided to increase the collimation of the rays which ultimately exit the lamp housing tube. The collimation of divergent light rays enables the lamp to better control the radiation in the target region on the substrate surface. Similar to the insert tube 402 discussed above, the insert caps 802 and 840 also serve as a cooling path to facilitate heat transfer from the lamp 36 to the outside world and/or the cooling fluid flowing in the coolant passage 206 (FIG. 3) formed in the lamphead. As a result, bulb life of the lamp 36 is improved. It has been observed that the use of the insert cap enables about 30%-40% and possibly up to 50% or more power to be delivered to the target without significant bulb swelling.

FIG. 8C shows a radiant intensity distribution plot 860 of a lamp tube using the insert cap 802. FIG. 8D shows a radiant intensity distribution plot 870 of a lamp tube using the insert cap 840. In the plots 860 and 870, the direction of angle of −180 is the optical axis direction normal to the substrate surface. The radiant intensity distribution is shown in the angular range of from −90 degrees to +90 degrees. The plots 860 and 870 show strong peaks remain in the vicinity of −180 degrees. The number in the left top column is the light intensity at −135 degrees divided by the light intensity at −180 degrees. The number can be used as a reference index to show how collimated the light is. The smaller the number is, the more collimated the light is. As can be seen, the plots 860 and 870 indicate a lamp tube using the insert cap 802 or 840 produces a light that is more collimated than the light produced by the lamp tube using the specular reflector 88 without the insert cap 802 (plot 462 shown in FIG. 4C).

Table 1 below illustrates a comparison in terms of the power of the radiant energy between the conventional lamp housing tube using only a specular reflector ("base model") and a lamp housing tube using insert cap/tube according to different implementations discussed in this disclosure.

TABLE 1

| Implementation | Total Power relative to base model | I-135/ I-180 | Intensity ratio relative to base model |
|---|---|---|---|
| Base Model | 1.00 | 0.667 | 1.000 |
| FIG. 4A | 0.92 | 0.605 | 0.907 |
| FIG. 5A | 0.81 | 0.500 | 0.750 |
| FIG. 6 | 0.84 | 0.648 | 0.972 |
| FIG. 7A | 0.80 | 0.534 | 0.800 |
| FIG. 7B | 0.86 | 0.538 | 0.807 |
| FIG. 8A | 0.94 | 0.500 | 0.750 |
| FIG. 8B | 0.89 | 0.551 | 0.826 |

Figure 9:
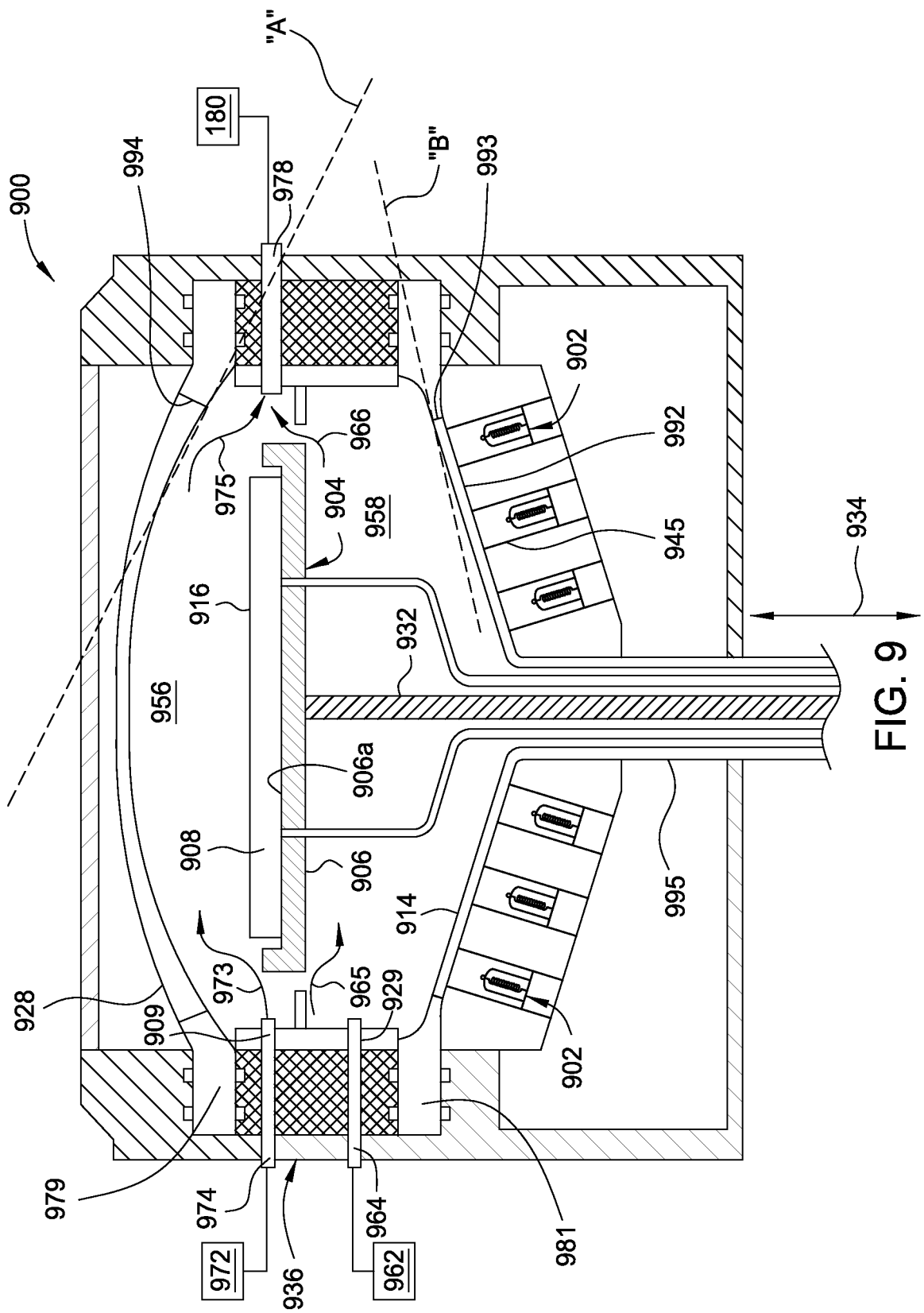
FIG. 9 illustrates a schematic sectional view of an exemplary backside heating process chamber in which the radiant heating source may be benefit from implementations of the present disclosure.

FIG. 9 illustrates a schematic sectional view of an exemplary backside heating process chamber 900 in which the radiant heating source may be benefit from implementations of the present disclosure. The process chamber 900 has an array of radiant heating lamps 902 for heating, among other components, a back side 904 of a substrate support 906 disposed within the process chamber 900. In some implementations, the array of radiant heating lamps may be alternatively or additionally disposed over the upper dome 928. The substrate support 906 is located within the process chamber 900 between an upper dome 928 and a lower dome 914. The upper dome 928, the lower dome 914 and a base ring 936 that is disposed between the upper dome 928 and lower dome 914 generally define an internal region of the process chamber 900.

The substrate support 906, while located in the processing position, divides the internal volume of the process chamber 900 into a process gas region 956 that is above the substrate, and a purge gas region 958 below the substrate support 906. The substrate support 906 is rotated during processing by a central shaft 932. The substrate support 106 is supported by the central shaft 932, which moves the substrate 908 in an up and down direction 934 during loading and unloading, and in some instances, processing of the substrate 908.

The upper dome 928 generally includes a central window portion 999 which passes the heat radiations, and a peripheral flange 979 for supporting the central window portion 999. The central window portion 999 may have a generally circular periphery. The peripheral flange 979 engages the central window portion 999 around a circumference of the central window portion 999 along a support interface 994, which is an intersection of the central window portion 999 and the peripheral flange 979.

The lower dome 914 generally includes a stem portion 995, a peripheral flange 981, and a bottom 992 radially extended to connect the stem portion 995 and the peripheral flange 981. The peripheral flange 981 is configured to surround a circumference of the bottom 992 along a support interface 993, which is an intersection of the bottom 992 and the peripheral flange 981. The peripheral flange 981 and the bottom 992, when combined with the upper dome 928 and the base ring 936, generally define an internal volume of the process chamber 900. In general, the central window portion 999 of the upper dome 928 and the bottom 992 of the lower dome 914 are formed from an optically transparent material such as quartz. The thickness and the degree of curvature of the upper dome 928 and the lower dome 914 may be configured to provide a flatter geometry for uniform flow uniformity in the process chamber. For example, the central window portion 999 of the upper dome 928 may form an angle of about 8° to about 16° with respect to a substrate receiving surface 906a of the substrate support 906. That is, a tangent line "A" on an inside surface (facing the substrate) of the central window portion 999 that passes through the support interface 994 is at an angle of about 8° to about 16° with respect to the substrate receiving surface 906a of the substrate support 906. In one example, the tangent line "A" is at an angle of about 10° with respect to the substrate receiving surface 906a of the substrate support 906.

Similarly, the bottom 992 of the lower dome 914 may be at an angle of about 8° to about 16° with respect to a substrate receiving surface 906a of the substrate support 906. That is, a tangent line "B" on an inside surface (facing the substrate) of the bottom 992 that passes through the support interface 993 is at an angle of about 8° to about 16° with respect to the substrate receiving surface 906a of the substrate support 906. In one example, the tangent line "B" is at an angle of about 10° with respect to the substrate receiving surface 906a of the substrate support 906.

One or more lamps, such as an array of lamps 902, can be disposed adjacent to and beneath the lower dome 914 in a specified, optimal desired manner around the central shaft 932 to independently control the temperature at various regions of the substrate 908 as the process gas passes over, facilitating the deposition of a material onto the upper surface of the substrate 908. The lamps 902 may be configured to include bulbs and be configured to heat the substrate 908 to a temperature within a range of about 200 degrees Celsius to about 1600 degrees Celsius. The lamps 902 are positioned within a lamphead assembly 945. In various implementations, the lamphead assembly 945 can be modified to include an insert tube, insert cab, or any associated features as discussed above with respect to FIGS. 4A-8D.

The base ring 936 may have a ring body sized to be received within an inner circumference of the processing chamber 900. Process gas(es) supplied from a gas delivery system is introduced to a process gas supply source 972 and into the process gas region 956 through a process gas inlet 974 disposed in the sidewall of the base ring 936. The process gas inlet 974 may include one or more gas injects for delivering one or more individual gas flows. During process, the substrate support 906 may be located in the processing position, which is adjacent to and at about the same elevation as the process gas inlet 974, allowing the process gas to flow up and round along flow path 973 across the upper surface of the substrate 908 in a laminar flow fashion. The process gas exits the process gas region 956 (along flow path 975) through a gas outlet 978 located on the side of the process chamber 900 opposite the process gas inlet 974. Removal of the process gas through the gas outlet 978 may be facilitated by an exhaust system 980 coupled thereto.

Similarly, purge gas may be supplied from a gas delivery system to a purge gas source 962 and into the purge gas region 958 through an optional purge gas inlet 964 or through the process gas inlet 974 disposed in the sidewall of the base ring 936 through the plurality of gas passages 929. During the film formation process, the substrate support 906 may be located at a position such that the purge gas flows down and round along flow path 965 across back side 904 of the substrate support 906 in a laminar flow fashion.

The above described implementations of the present disclosure and their implementations are related to processing chambers for processing of materials such as semiconductor substrates. Application of the implementations of the present disclosure in a thin film and a solar film processing chamber is also contemplated. Other applications such as light reflection applications where a better more robust reflector is useful, light delivery systems, solar collectors, laser systems are also contemplated.

Implementations of the present disclosure allow for better control of radiation in a target region on a substrate surface by positioning an insert tube or cab between a specular reflector and a lamp disposed in a lamp housing tube of the lamphead. The insert tube or cab reflects and collimates radiant energy from the lamp toward the substrate to radiate a limited area of the substrate, thereby enhancing the uniformity and intensity of the collimated light upon existing the lamp housing tube. In addition, the insert tube or cab may be made of quartz and serve as a cooling path to facilitate heat transfer from the lamp to the outside world and/or the cooling fluid flowing in the coolant passage formed in the lamphead. The use of the insert tube or cab enables up to 50% or more power to be delivered to the target region without significant bulb swelling. As a result, bulb life of the lamp is improved.

Reference throughout this specification to "one implementation," "certain implementations," "one or more implementations" or "an implementation" means that a particular feature, structure, material, or characteristic described in connection with the implementation is included in at least one implementation of the disclosure. Thus, the appearances of the phrases such as "in one or more implementations," "in certain implementations," "in one implementation" or "in an implementation" in various places throughout this specification are not necessarily referring to the same implementation of the disclosure. Furthermore, the particular features, structures, materials, or characteristics may be combined in any suitable manner in one or more implementations.

While the foregoing is directed to implementations of the present disclosure, other and further implementations of the disclosure may be devised without departing from the basic scope thereof, and the scope thereof is determined by the claims that follow.

The invention claimed is:

1. A lamphead assembly for heating a substrate disposed on a substrate support, comprising:
   a lamp housing tube comprising a lamp disposed therein, the lamp housing tube having an open end; and
   an insert tube disposed within the lamp housing tube, wherein the insert tube surrounds at least a portion of the lamp, and the insert tube comprises:
      a cylindrical lower portion disposed adjacent to the open end of the lamp housing tube; and
      a tapered upper portion integrated with the cylindrical lower portion as one body, wherein a wall thickness of the tapered upper portion tapers from an outer surface of the insert tube toward an inner surface of the insert tube, wherein the insert tube has a constant inner diameter throughout an entire length of the cylindrical lower portion and the tapered upper portion.

2. The lamphead assembly of claim 1, further comprising:
   a reflector disposed between the insert tube and the lamp housing tube, wherein the reflector, the insert tube, and the lamp housing tube are coaxial.

3. The lamphead assembly of claim 2, wherein the reflector and the lamp housing tube are formed as an integral body.

4. The lamphead assembly of claim 2, wherein the reflector is formed as a sleeve having a conical shaped upper portion and a cylindrical shaped lower portion.

5. The lamphead assembly of claim 1, wherein the outer surface of the insert tube includes an outer surface of the tapered upper portion and an outer surface of the cylindrical lower portion, and wherein a longitudinal direction of the outer surface of the tapered upper portion and a longitudinal direction of the outer surface of the cylindrical lower portion forms an angle equal to or greater than 1 degree to less than or equal to 45 degrees.

6. The lamphead assembly of claim 3, wherein the insert tube is removably engaged or disengaged with the reflector.

7. The lamphead assembly of claim 1, wherein the insert tube comprises quartz, sapphire, silica, alumina, alumina-silica glass, or yttrium-alumina-garnet (YAG).

8. The lamphead assembly of claim 1, further comprising:
   an optical lens disposed within the inner surface of the insert tube adjacent to the open end of the lamp housing tube.

9. The lamphead assembly of claim 8, wherein the optical lens is a simple spherical lens.

* * * * *